United States Patent
Ueno et al.

(10) Patent No.: US 8,650,526 B2
(45) Date of Patent: Feb. 11, 2014

(54) METHOD AND PROGRAM FOR CREATING EQUIVALENT CIRCUIT FOR THREE-TERMINAL CAPACITOR

(71) Applicant: Murata Manufacturing Co., Ltd., Nagaokakyo (JP)

(72) Inventors: Haruhiko Ueno, Nagaokakyo (JP); Haruki Ando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/784,884

(22) Filed: Mar. 5, 2013

(65) Prior Publication Data

US 2013/0239083 A1 Sep. 12, 2013

(30) Foreign Application Priority Data

Mar. 7, 2012 (JP) ................................ 2012-049995

(51) Int. Cl.
*G06F 17/50* (2006.01)

(52) U.S. Cl.
USPC ............ 716/132; 716/111; 716/126; 716/136

(58) Field of Classification Search
USPC .................................. 716/111, 126, 132, 136
See application file for complete search history.

(56) References Cited

U.S. PATENT DOCUMENTS

| | | | | |
|---|---|---|---|---|
| 5,180,996 A * | 1/1993 | Shiga | ................................ | 331/77 |
| 5,815,367 A | 9/1998 | Asakura et al. | | |
| 6,697,749 B2 * | 2/2004 | Kamitani | ....................... | 702/107 |
| 6,914,767 B2 * | 7/2005 | Togashi et al. | ................. | 361/303 |
| 7,224,572 B2 * | 5/2007 | Togashi et al. | .............. | 361/306.3 |
| 7,394,647 B2 * | 7/2008 | Togashi | ...................... | 361/321.1 |
| 7,613,007 B2 * | 11/2009 | Amey et al. | .................... | 361/763 |
| 8,120,891 B2 * | 2/2012 | Takashima et al. | ......... | 361/321.2 |
| 2005/0267724 A1 | 12/2005 | Niki et al. | | |
| 2009/0103243 A1 * | 4/2009 | Mizukoshi et al. | ............ | 361/523 |
| 2012/0126792 A1 * | 5/2012 | Groves et al. | ............. | 324/140 R |

FOREIGN PATENT DOCUMENTS

| | | |
|---|---|---|
| JP | 10-012491 A | 1/1998 |
| JP | 2004-071642 A | 3/2004 |
| JP | 2005-339157 A | 12/2005 |

\* cited by examiner

*Primary Examiner* — Naum Levin
(74) *Attorney, Agent, or Firm* — Keating & Bennett, LLP

(57) ABSTRACT

In a method for creating an equivalent circuit for a three-terminal capacitor including first, second, third and fourth electrodes, a first capacitor conductor connected between the first and second electrodes, and a second capacitor conductor connected between the third and fourth electrodes, the equivalent circuit includes a first line connecting the first electrode to the second electrode; a second line connecting the third electrode to the fourth electrode; a third line that includes a first capacitor component and that connects the first line to the second line; a first circuit component including a first inductor component and a first resistor component provided between a connection portion between the second line and the third line and the third electrode; and a second circuit component including a second inductor component and a second resistor component provided between the connection portion and the fourth electrode.

20 Claims, 8 Drawing Sheets

100

METHOD AND PROGRAM FOR CREATING EQUIVALENT CIRCUIT FOR THREE-TERMINAL CAPACITOR

BACKGROUND OF THE INVENTION

1. Field of the Invention

The present invention relates to a method for creating an equivalent circuit and a program for creating an equivalent circuit. More particularly, the present invention relates to a method and a program for creating an equivalent circuit for a three-terminal capacitor.

2. Description of the Related Art

Simulation can be used in design of circuits of electronic devices and in design of printed circuit boards. In the simulation, models of equivalent circuits of electronic components, such as three-terminal capacitors, are often incorporated in the circuits of the electronic devices for use. For example, an equivalent circuit illustrated in FIG. 9 is known as an exemplary equivalent circuit for a three-terminal capacitor in related art. FIG. 9 is an equivalent circuit diagram of a three-terminal capacitor in the related art.

The three-terminal capacitor in FIG. 9 includes resistors R500, R501, R502, and R504, coils L500, L501, and L502, a capacitor C500, and outer electrode 502a to 502c. The resistor R500, the coil L500, the resistor R501, and the coil L501 are connected in series between the outer electrodes 502a and 502b. The resistor R502, the capacitor C500, and the coil L502 are connected in series between a connection portion between the coil L500 and the coil L501 and the outer electrode 502c. The resistor R504 is connected in parallel to the capacitor C500.

In the equivalent circuit illustrated in FIG. 9, it is difficult to precisely simulate a circuit board on which the three-terminal capacitor is mounted, as described below. FIG. 10 illustrates how a three-terminal capacitor 500 is mounted on a circuit board 508.

The three-terminal capacitor 500 includes four outer electrode 502a, 502b, 502d, and 502e, as illustrated in FIG. 10. The outer electrodes 502a and 502b are generally used as input and output terminals. The outer electrodes 502d and 502e are generally used as a ground terminal. Such a three-terminal capacitor 500 is mounted on the circuit board 508. More specifically, the circuit board 508 includes land electrode 510a to 510d. The outer electrodes 502a, 502b, 502d, and 502e are joined to the land electrodes 510a to 510d, respectively.

However, the outer electrodes 502d and 502e are considered as one outer electrode 502c in the equivalent circuit in the related art. Accordingly, the impedance between the land electrodes 510c and 510d is not considered in the simulation using the equivalent circuit in the related art. In addition, since the parasitic inductance and the parasitic capacitance in the land electrode 510c are different from those in the land electrode 510d when the land electrode 510c has a shape different from that of the land electrode 510d, the current flowing through the outer electrode 502d differs from the current flowing through the outer electrode 502e. The difference in current is not also considered in the equivalent circuit in the related art. Accordingly, it is difficult to precisely simulate the entire circuit board 508 on which the three-terminal capacitor 500 is mounted.

For example, a method of optimizing circuit constants described in Japanese Unexamined Patent Application Publication No. 2004-71642 is known as a technology concerning equivalent circuits in the related art. However, no description of precise simulation in a circuit using a three-terminal capacitor exists in Japanese Unexamined Patent Application Publication No. 2004-71642.

SUMMARY OF THE INVENTION

Accordingly, preferred embodiments of the present invention provide a method for creating an equivalent circuit and a program for creating an equivalent circuit, which are capable of precisely simulating a circuit board on which a three-terminal capacitor is mounted.

According to a preferred embodiment of the present invention, a method for creating an equivalent circuit for a three-terminal capacitor including first, second, third and fourth terminals, a first capacitor conductor connected between the first terminal and the second terminal, and a second capacitor conductor connected between the third terminal and the fourth terminal includes creating an equivalent circuit including a first line that connects the first terminal to the second terminal; a second line that connects the third terminal to the fourth terminal; a third line that includes a first capacitor component provided thereon and that connects the first line to the second line; a first circuit component that includes at least one of a first inductor component and a first resistor component provided between a connection portion between the second line and the third line and the third terminal; and a second circuit component that includes at least one of a second inductor component and a second resistor component provided between the connection portion between the second line and the third line and the fourth terminal; and calculating values of the first capacitor component, the first inductor component, the first resistor component, the second inductor component, and the second resistor component when a difference between a first S parameter acquired from the equivalent circuit and a certain second S parameter is smaller than a certain value.

According to another preferred embodiment of the present invention, a program for creating an equivalent circuit for a three-terminal capacitor including first, second, third and fourth terminals, a first capacitor conductor connected between the first terminal and the second terminal, and a second capacitor conductor connected between the third terminal and the fourth terminal causes a computer to execute creating an equivalent circuit including a first line that connects the first terminal to the second terminal; a second line that connects the third terminal to the fourth terminal; a third line that has a first capacitor component provided thereon and that connects the first line to the second line; a first circuit component that includes at least one of a first inductor component and a first resistor component provided between a connection portion between the second line and the third line and the third terminal; and a second circuit component that includes at least one of a second inductor component and a second resistor component provided between the connection portion between the second line and the third line and the fourth terminal; and calculating values of the first capacitor component, the first inductor component, the first resistor component, the second inductor component, and the second resistor component when a difference between a first S parameter acquired from the equivalent circuit and a certain second S parameter is smaller than a certain value.

According to various preferred embodiments of the present invention, it is possible to precisely simulate a circuit board on which a three-terminal capacitor is mounted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A method for creating an equivalent circuit and a program for creating an equivalent circuit according to preferred embodiments of the present invention will herein be described with reference to the attached drawings. In the method for creating an equivalent circuit and the program for creating an equivalent circuit described below, a process described below is roughly performed. First, S parameters of a three-terminal capacitor are actually measured. The S parameters that have been actually measured are hereinafter referred to as measured S parameters (measured values). Then, parameters (the values of capacitor components, inductor components, and resistor components) of an equivalent circuit having a predetermined circuit configuration are varied to calculate the S parameters by using a computer so as to determine the respective parameters when S parameters close to the measured S parameters are acquired. The S parameters that have been acquired by calculation are hereinafter referred to as calculated S parameters. The above process creates the equivalent circuit of the three-terminal capacitor.

Figure 1:
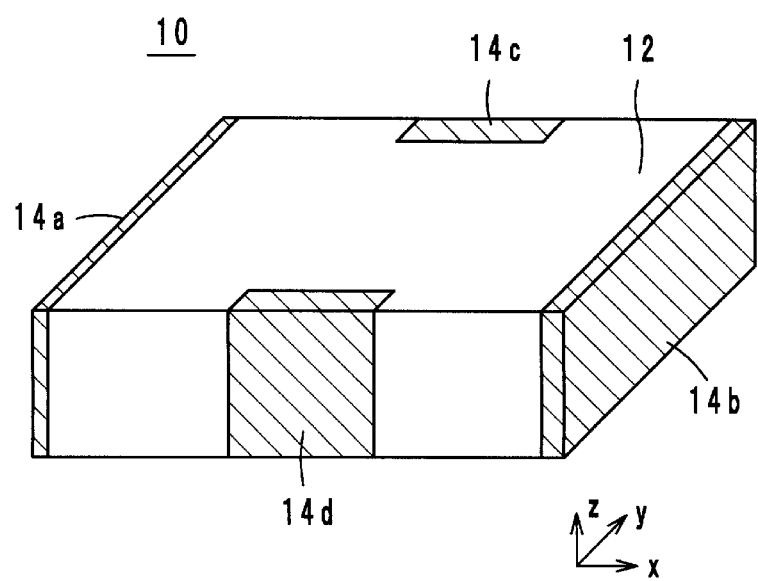
FIG. 1 is an external perspective view of a three-terminal capacitor.
Figure 2:
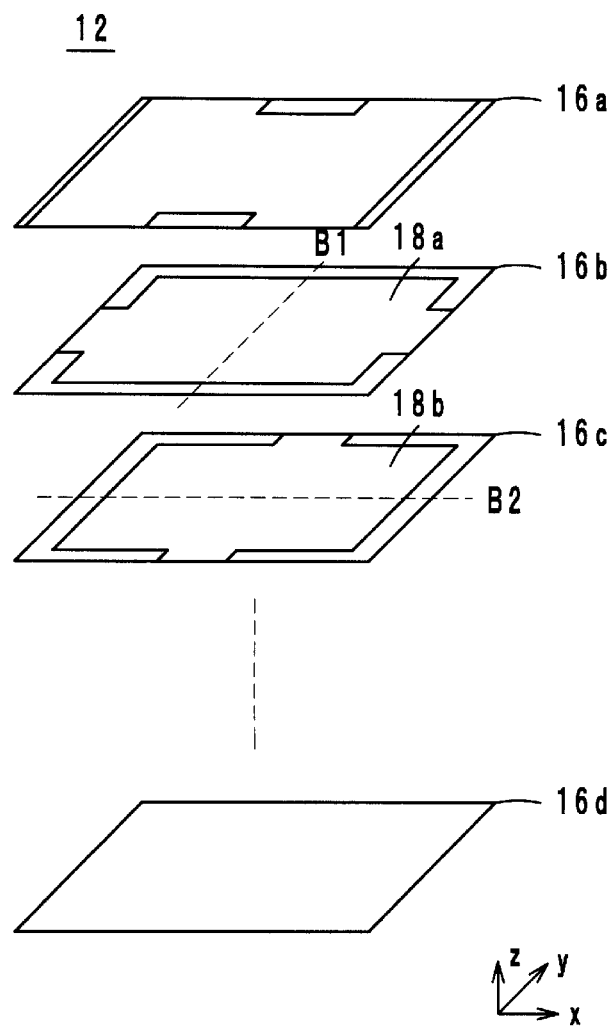
FIG. 2 is an exploded perspective view of the three-terminal capacitor.

An exemplary structure of a three-terminal capacitor to be simulated in the method for creating an equivalent circuit and the program for creating an equivalent circuit according to the preferred embodiments of the present invention will now be described with reference to FIGS. 1 and 2. FIG. 1 is an external perspective view of a three-terminal capacitor 10. FIG. 2 is an exploded perspective view of the three-terminal capacitor 10.

The three-terminal capacitor 10 is a chip capacitor. As illustrated in FIGS. 1 and 2, the three-terminal capacitor 10 includes a multilayer body 12, outer electrodes 14a to 14d (collectively referred to as an outer electrode 14), and capacitor conductors 18a and 18b (collectively referred to as a capacitor conductor 18).

The multilayer body 12 preferably has a rectangular or substantially rectangular parallelepiped shape, as illustrated in FIG. 1. Rectangular or substantially rectangular ceramic layers 16a to 16d (collectively referred to as a ceramic layer 16) are stacked to define the multilayer body 12, as illustrated in FIG. 2. A main surface at the negative direction side in the z-axis direction of the multilayer body 12 is a mounting surface opposing a circuit board when the three-terminal capacitor 10 is mounted on the circuit board.

The ceramic layer 16 preferably has a rectangular or substantially rectangular shape and preferably is made of dielectric ceramic. A main surface at the positive direction side in the z-axis direction of the ceramic layer 16 is hereinafter referred to as a front surface and a main surface at the negative direction side in the z-axis direction of the ceramic layer 16 is hereinafter referred to as a rear surface.

The capacitor conductor 18a is provided on the front surface of the ceramic layer 16b and preferably has a rectangular or substantially rectangular shape. The capacitor conductor 18a extends to the short sides at both sides in the x-axis direction of the ceramic layer 16b.

The capacitor conductor 18b is provided on the front surface of the ceramic layer 16c and preferably has a rectangular or substantially rectangular shape. Accordingly, the capacitor conductor 18a opposes the capacitor conductor 18b via the ceramic layer 16b. The capacitor conductor 18b extends to the long sides at both sides in the y-axis direction of the ceramic layer 16c.

The multiple ceramic layers 16b on which the capacitor conductors 18a are provided and the multiple ceramic layers 16c on which the capacitor conductors 18b are provided are stacked so as to be alternately arranged in the z-axis direction.

An end surface at the negative direction side in the x-axis direction of the multilayer body 12 is covered with the outer electrode 14a. An end surface at the positive direction side in the x-axis direction of the multilayer body 12 is covered with the outer electrode 14b. Accordingly, the capacitor conductor 18a is connected between the outer electrodes 14a and 14b.

The outer electrode 14c is provided on a side surface at the positive direction side in the y-axis direction of the multilayer body 12. The outer electrode 14d is provided on a side surface at the negative direction side in the y-axis direction of the multilayer body 12. Accordingly, the capacitor conductor 18b is connected between the outer electrodes 14c and 14d.

A non-limiting example of a method of manufacturing the three-terminal capacitor 10 will now be described. FIGS. 1 and 2 are incorporated as the drawings for description of the method of manufacturing the three-terminal capacitor 10.

First, binder and organic solvent are added to ceramic powder made of $BaTiO_3$ or the like and the ceramic powder is put into a ball mill to produce ceramic slurry by wet mixing. The ceramic slurry is formed into a sheet shape on a carrier sheet by a doctor blade method and is dried to produce a ceramic green sheet to be used as the ceramic layer 16. The main component of the ceramic powder may be, for example, $CaTiO_3$, $SrTiO_3$, or $CaZrO_3$. A Mn compound, a Mg compound, a Si compound, a Co compound, a Ni compound, a rare earth compound, etc. may be added as an additional component of the ceramic powder, for example.

Next, paste made of conductive material is applied on the ceramic green sheet to be used as the ceramic layer 16 by screen printing to form the capacitor conductor 18. The paste made of conductive material results from addition of organic binder and organic solvent to metal powder. The metal powder is, for example, Ni, Cu, Ag, Pd, Ag—Pd alloy, or Au.

Next, the ceramic green sheets to be used as the ceramic layers 16 are stacked to produce a mother multilayer body that is not fired. The mother multilayer body that is not fired is subjected to pressing.

Next, the mother multilayer body that is not fired is cut into a certain size to produce the multiple multilayer bodies 12 that are not fired. The front surface of each multilayer body 12 is subjected to polishing, such as barrel polishing.

Next, the multilayer body 12 that is not fired is fired. The firing temperature is, for example, about 1,200° C. to 1,300° C.

Next, the outer electrode 14 is formed on the multilayer body 12. Specifically, conductive paste containing Cu, Ni, Ag, Pd, Ag—Pd alloy, Au, etc. is applied on the front surface of the multilayer body 12 by a known dip method or slit technique. Then, the applied conductive paste is baked to form the under-layer electrode. The under-layer electrode is plated with Ni and Sn to form the outer electrode 14. The three-terminal capacitor 10 is manufactured by the above process.

Figure 3:
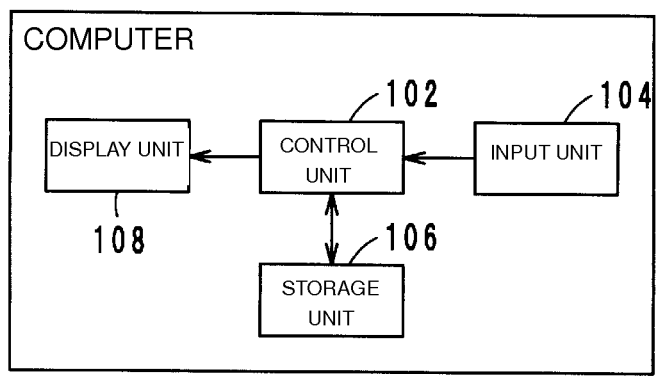
FIG. 3 is a block diagram illustrating an exemplary configuration of a computer executing a method for creating an equivalent circuit and a program for creating an equivalent circuit.

The method for creating an equivalent circuit and the program for creating an equivalent circuit will now be described. First, the configuration of a computer executing the method for creating an equivalent circuit and the program for creating an equivalent circuit will be described with reference to FIG. 3. FIG. 3 is a block diagram illustrating an exemplary configuration of a computer 100 executing the method for creating an equivalent circuit and the program for creating an equivalent circuit.

Referring to FIG. 3, the computer 100 includes a control unit 102, an input unit 104, a storage unit 106, and a display unit 108. The control unit 102 is, for example, a central processing unit (CPU) and controls the entire computer 100. The input unit 104 includes a keyboard, a mouse, etc. and accepts an input by a user. The storage unit 106 is, for example, a memory or a hard disk and stores information input with the input unit 104, information generated by the control unit 102, the program for creating an equivalent circuit, and so on. The display unit 108 is, for example, a monitor and displays an arithmetic result in the control unit 102.

Figure 4:
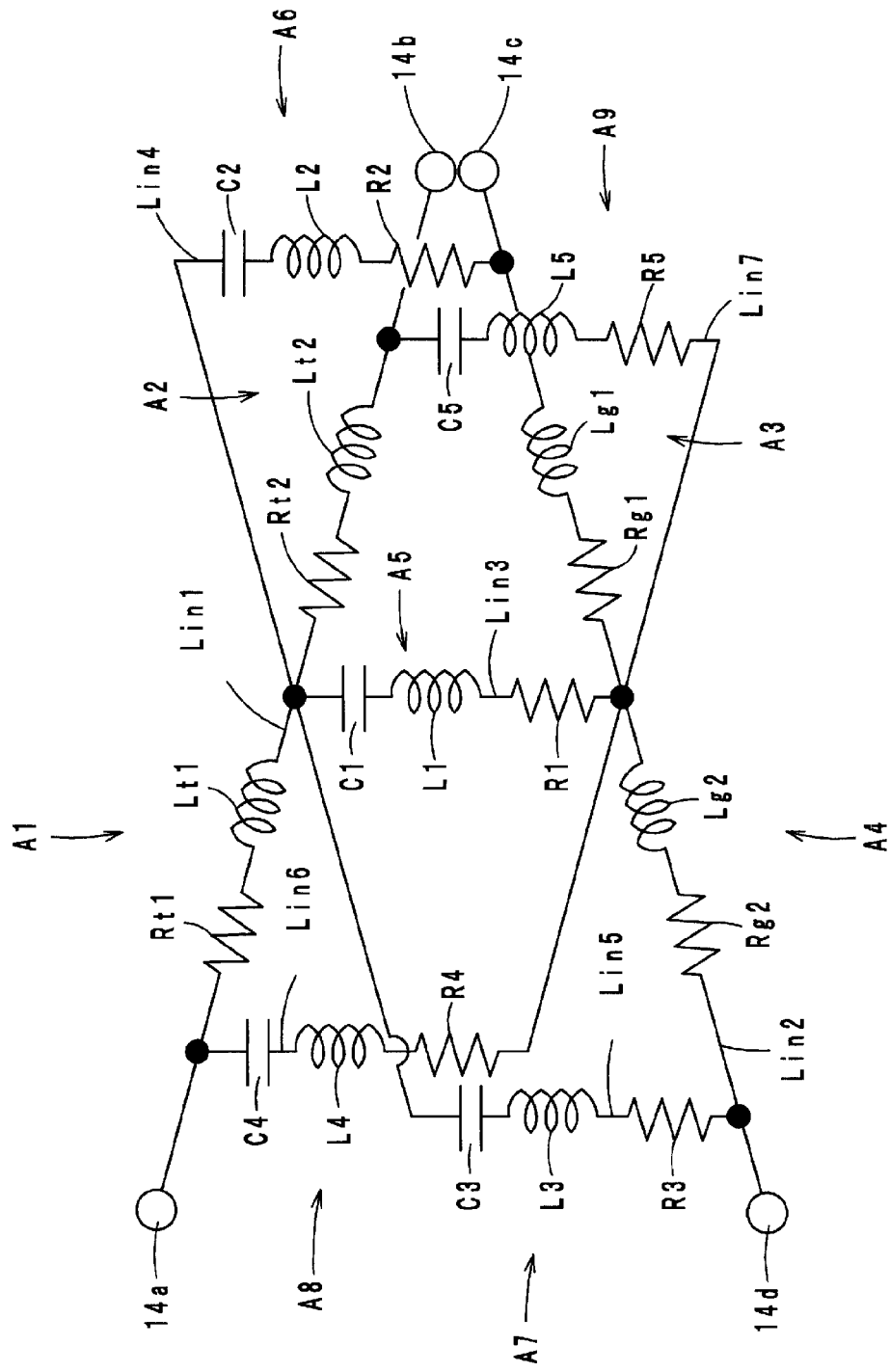
FIG. 4 illustrates an exemplary equivalent circuit of the three-terminal capacitor.

An exemplary equivalent circuit of the three-terminal capacitor 10 will now be described with reference to FIG. 4. FIG. 4 illustrates an exemplary equivalent circuit 200 of the three-terminal capacitor 10.

Referring to FIG. 4, the equivalent circuit 200 includes the outer electrodes 14a to 14d, lines Lin1 to Lin7, and circuit components A1 to A9.

The line Lin1 connects the outer electrode 14a to the outer electrode 14b. The line Lin2 connects the outer electrode 14c to the outer electrode 14d. The line Lin3 connects the line Lin1 to the line Lin2.

The line Lin4 connects a connection portion between the line Lin1 and the line Lin3 to the outer electrode 14c. The line Lin5 connects the connection portion between the line Lin1 and the line Lin3 to the outer electrode 14d.

The line Lin6 connects a connection portion between the line Lin2 and the line Lin3 to the outer electrode 14a. The line Lin7 connects the connection portion between the line Lin2 and the line Lin3 to the outer electrode 14b.

The circuit component A1 is provided between the connection portion between the line Lin1 and the line Lin3 and the outer electrode 14a and includes a resistor component Rt1 and an inductor component Lt1. The resistor component Rt1 is connected in series to the inductor component Lt1. The circuit component A2 is provided between the connection portion between the line Lin1 and the line Lin3 and the outer electrode 14b and includes a resistor component Rt2 and an inductor component Lt2. The resistor component Rt2 is connected in series to the inductor component Lt2. In the present preferred embodiment, the resistor component Rt1 is equal to the resistor component Rt2 and the inductor component Lt1 is equal to the inductor component Lt2.

The inductor component Lt1 is electromagnetically coupled to the inductor component Lt2 with a coupling coefficient K1. The circuit component A3 is provided between the connection portion between the line Lin2 and the line Lin3 and the outer electrode 14c and includes a resistor component Rg1 and the inductor component Lg1. The resistor component Rg1 is connected in series to the inductor component Lg1. The circuit component A4 is provided between the connection portion between the line Lin2 and the line Lin3 and the outer electrode 14d and includes a resistor component Rg2 and the inductor component Lg2. The resistor component Rg2 is connected in series to the inductor component Lg2. In the present preferred embodiment, the resistor component Rg1 preferably is equal to the resistor component Rg2 and the inductor component Lg1 preferably is equal to the inductor component Lg2, for example.

The inductor component Lg1 is electromagnetically coupled to the inductor component Lg2 with a coupling coefficient K2.

The circuit component A5 is provided on the line Lin3 and includes a capacitor component C1, an inductor component L1, and a resistor component R1. The capacitor component C1, the inductor component L1, and the resistor component R1 are connected in series to each other.

The circuit component A6 is provided between the connection portion between the line Lin1 and the line Lin3 and the outer electrode 14c and includes a capacitor component C2, a resistor component R2, and an inductor component L2. The capacitor component C2, the resistor component R2, and the inductor component L2 are connected in series to each other. The circuit component A7 is provided between the connection portion between the line Lint and the line Lin3 and the outer electrode 14d and includes a capacitor component C3, a resistor component R3, and an inductor component L3. The capacitor component C3, the resistor component R3, and the inductor component L3 are connected in series to each other. In the present preferred embodiment, the capacitor component C2 preferably is equal to the capacitor component C3, the inductor component L2 preferably is equal to the inductor component L3, and the resistor component R2 preferably is equal to the resistor component R3.

The circuit component A8 is provided between the connection portion between the line Lin2 and the line Lin3 and the outer electrode 14a and includes a capacitor component C4, an inductor component L4, and a resistor component R4. The capacitor component C4, the inductor component L4, and the resistor component R4 are connected in series to each other. The circuit component A9 is provided between the connection portion between the line Lin2 and the line Lin3 and the outer electrode 14b and includes a capacitor component C5, an inductor component L5, and a resistor component R5. The capacitor component C5, the inductor component L5, and the resistor component R5 are connected in series to each other. In the present preferred embodiment, the capacitor component C4 is equal to the capacitor component C5, the inductor component L4 is equal to the inductor component L5, and the resistor component R4 is equal to the resistor component R5.

In the equivalent circuit 200 having the above configuration, the circuit components A1 and A2 correspond to the capacitor conductor 18a. The circuit components A3 and A4 correspond to the capacitor conductor 18b.

As described above, in the equivalent circuit 200, the circuit configuration when the outer electrodes 14a and 14c are viewed from the line Lin3 is symmetric to the circuit configuration when the outer electrodes 14b and 14d are viewed from the line Lin3.

Figure 5:
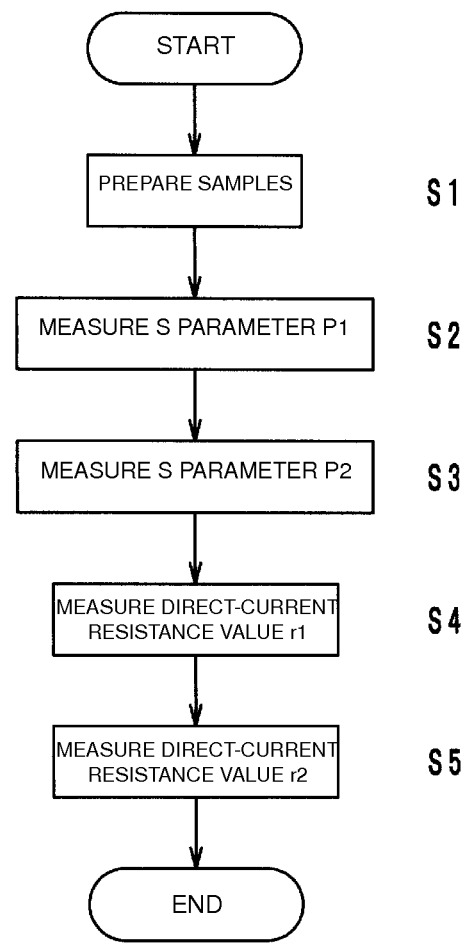
FIG. 5 is a flowchart illustrating a process of measuring parameters of the three-terminal capacitor, which is performed before the method for creating an equivalent circuit and the program for creating an equivalent circuit are created.
Figure 6A:
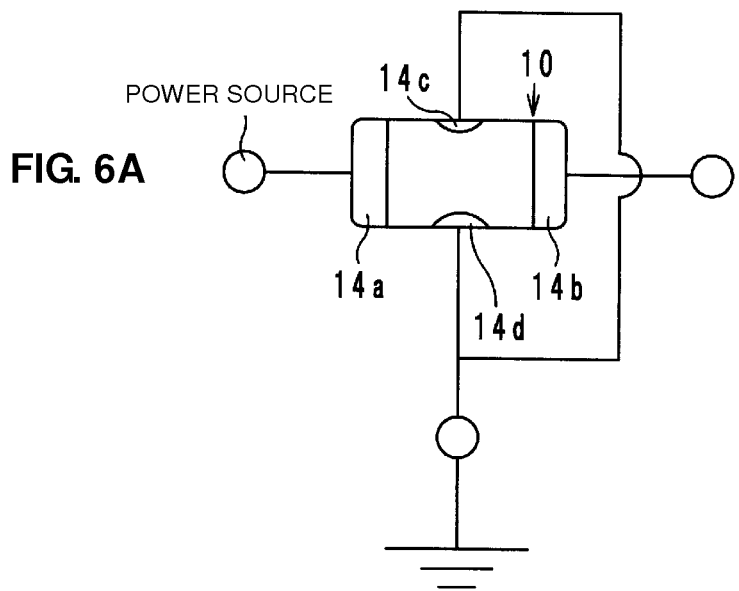
FIGS. 6A and 6B illustrate how the three-terminal capacitor is connected.
Figure 6B:
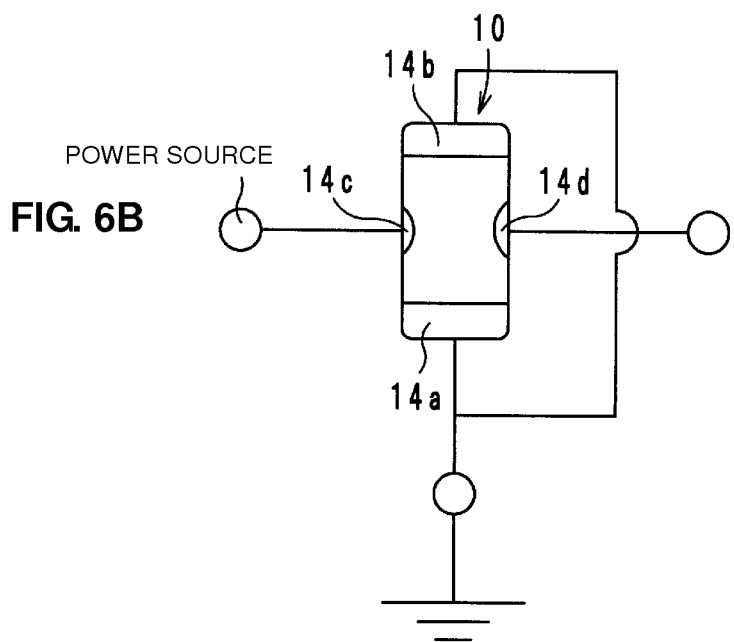
Figure 7:
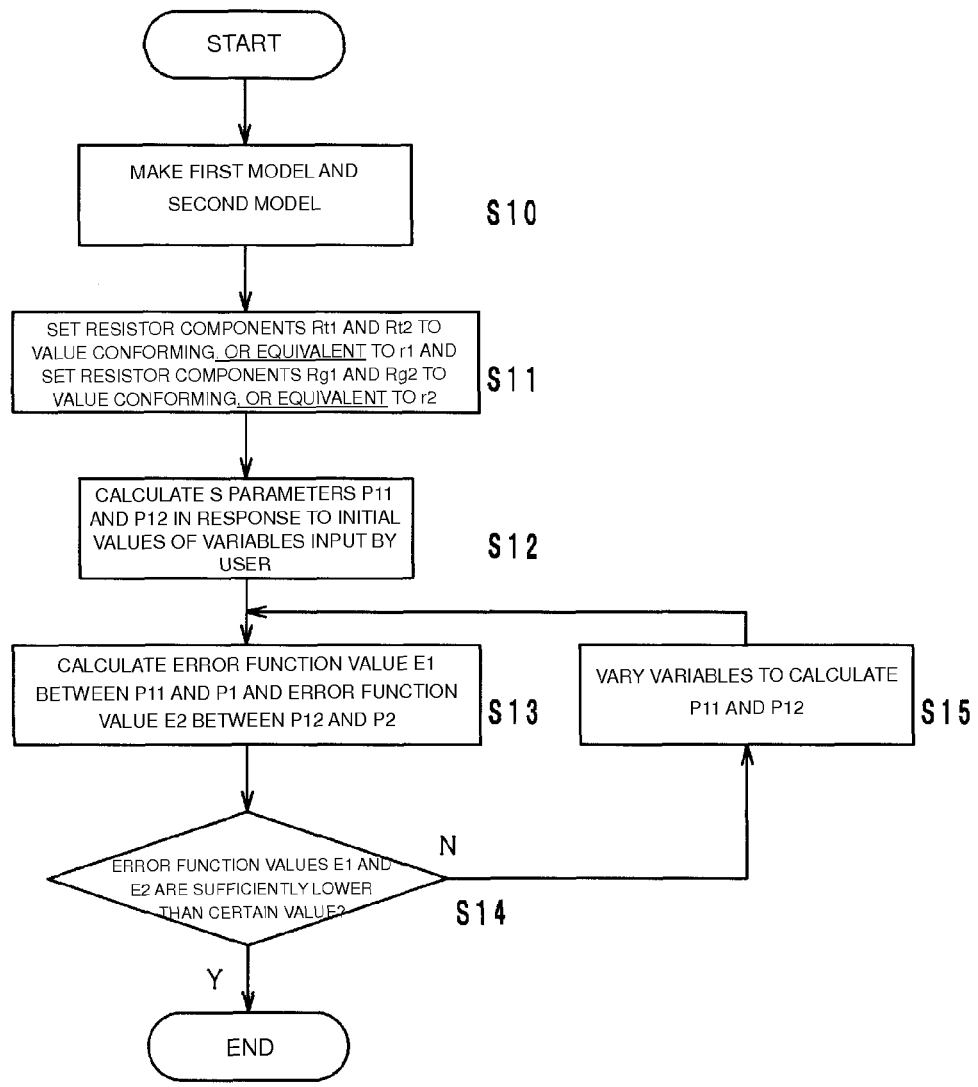
FIG. 7 is a flowchart illustrating an operational process performed by a control unit in the computer when the program for creating an equivalent circuit is executed.

Exemplary operations of the computer 100 when the method for creating an equivalent circuit and the program for creating an equivalent circuit are executed will now be described. FIG. 5 is a flowchart illustrating a process of measuring parameters of the three-terminal capacitor 10, which is performed before the method for creating an equivalent circuit and the program for creating an equivalent circuit are created. FIGS. 6A and 6B illustrate how the three-terminal capacitor 10 is connected. FIG. 7 is a flowchart illustrating an operational process performed by the control unit 102 in the computer 100 when the program for creating an equivalent circuit is executed.

Referring to FIG. 5, in Step S1, the user prepares samples of the multiple three-terminal capacitors 10. Then, the user mounts each three-terminal capacitor 10 on a circuit board so that the outer electrodes 14a and 14b are used as terminals to which power supply voltage or a signal is applied and the outer electrodes 14c and 14d are used as ground terminals in a manner illustrated in FIG. 6A. The mounting structure in FIG. 6A is hereinafter referred to as a first mounting structure. In addition, the user mounts each three-terminal capacitor 10 on the circuit board so that the outer electrodes 14c and 14d are used as terminals to which the power supply voltage or a signal is applied and the outer electrodes 14a and 14b are used as ground terminals in a manner illustrated in FIG. 6B. The mounting structure in FIG. 6B is hereinafter referred to as a second mounting structure.

In Step S2, the user measures a measured S parameter P1 of the three-terminal capacitor 10 in the first mounting structure. In Step S3, the user measures a measured S parameter P2 of the three-terminal capacitor 10 in the second mounting structure.

In Step S4, the user measures a direct-current resistance value r1 between the outer electrodes 14a and 14b of the three-terminal capacitor 10. In Step S5, the user measures a direct-current resistance value r2 between the outer electrodes 14c and 14d of the three-terminal capacitor 10. The parameters of the three-terminal capacitor 10 are measured in the above process.

Then, the user starts up the computer 100. Referring to FIG. 7, in Step S10, the control unit 102 makes a first model for calculating the S parameters in the first mounting structure and a second model for calculating the S parameters in the second mounting structure from the equivalent circuit 200 in response to an input by the user with the input unit 104.

The user inputs the direct-current resistance value r1 and the direct-current resistance value r2 with the input unit 104. In Step S11, the control unit 102 sets the resistor components Rt1 and Rt2 to a value conforming, or equivalent to the direct-current resistance value r1 and sets the resistor components Rg1 and Rg2 to a value conforming, or equivalent to the direct-current resistance value r2 in response to the input of the direct-current resistance value r1 and the direct-current resistance value r2 by the user with the input unit 104.

The user inputs initial values of the capacitor components C1 to C5, the inductor components L1 to L5, the resistor components R1 to R5, and the coupling coefficients K1 and K2 (hereinafter collectively referred to as variables) with the input unit 104. In Step S12, the control unit 102 uses the initial values to calculate a calculated S parameter P11 for the first model and a calculated S parameter P12 for the second model in response to the input of the initial values of the variables by the user with the input unit 104. The control unit 102 creates a graph of the calculated S parameters P11 and P12.

In Step S13, the control unit 102 calculates an error function value E1 (difference) between the calculated S parameter P11 calculated in Step S12 and the measured S parameter P1 measured in Step S2 and an error function value E2 (difference) between the calculated S parameter P12 calculated in Step S12 and the measured S parameter P2 measured in Step S3.

In Step S14, the control unit 102 determines whether the error function values E1 and E2 calculated in Step S13 are lower than a certain value. If the error function values E1 and E2 are sufficiently lower than the certain value (YES in Step S14), the control unit 102 determines the values of the variables at this time to be the circuit components of the equivalent circuit 200 and the process in FIG. 7 is terminated. If the error function values E1 and E2 are not sufficiently lower than the certain value (NO in Step S14), the process goes to Step S15.

In Step S15, the control unit 102 varies the variables to calculate the calculated S parameters P11 and P12. The control unit 102 repeats Steps S13 to S15 until the error function values E1 and E2 are made lower than the certain value. The variation of the variables is performed with, for example, Advanced Design System (ADS) (manufactured by Agilent Technologies Inc.).

Figure 9:
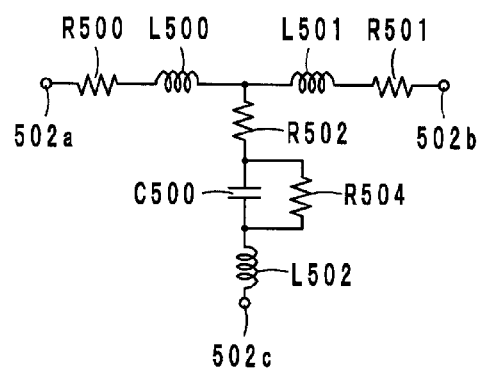
FIG. 9 is an exemplary equivalent circuit diagram of a three-terminal capacitor in related art.
Figure 10:
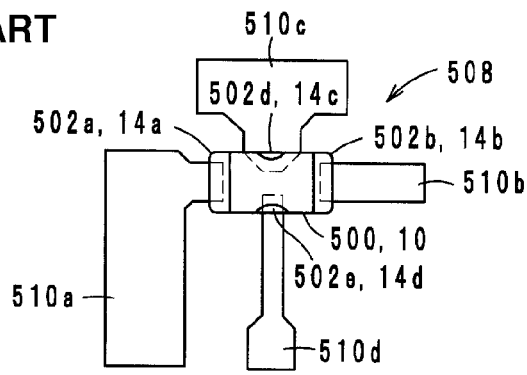
FIG. 10 illustrates how the three-terminal capacitor is mounted on a circuit board.

According to the method for creating an equivalent circuit and the program for creating an equivalent circuit of the preferred embodiments of the present invention, it is possible to precisely simulate the circuit on which the three-terminal capacitor 10 is mounted. More specifically, in the equivalent circuit in the related art illustrated in FIG. 9, the outer electrodes 502d and 502e are considered as one outer electrode 502c. Accordingly, in the simulation using the equivalent circuit in the related art, it is not possible to consider the impedance between the land electrodes 510c and 510d and the difference between the current flowing through the outer electrode 502d and the current flowing through the outer electrode 502e and, thus, it is difficult to precisely perform the simulation.

In contrast, according to the method for creating an equivalent circuit and the program for creating an equivalent circuit of the preferred embodiments of the present invention, the equivalent circuit 200 includes the outer electrodes 14c and 14d, the inductor component Lg1 and the resistor component Rg1 provided between the connection portion between the line Lin2 and the line Lin3 and the outer electrode 14c, and the inductor component Lg2 and the resistor component Rg2 provided between the connection portion between the line Lin2 and the line Lin3 and the outer electrode 14d. With this configuration, it is possible to join the outer electrode 14c to the land electrode 510c and the outer electrode 14d to the land electrode 510d to simulate the circuit on which the three-terminal capacitor 10 is mounted. Accordingly, in the simulation using the equivalent circuit 200, it is possible to consider the impedance between the land electrodes 510c and 510d and the difference between the current flowing through the outer electrode 502d and the current flowing through the outer electrode 502e. As a result, according to the method for creating an equivalent circuit and the program for creating an equivalent circuit of the preferred embodiments of the present invention, it is possible to precisely simulate the circuit on which the three-terminal capacitor 10 is mounted.

In addition, according to the method for creating an equivalent circuit and the program for creating an equivalent circuit of the preferred embodiments of the present invention, it is possible to simulate the circuit on which the three-terminal capacitor 10 to which the first mounting structure is applied is mounted and to simulate the circuit on which the three-terminal capacitor 10 to which the second mounting structure is applied is mounted. More specifically, in the equivalent circuit in the related art illustrated in FIG. 9, the outer electrodes 502d and 502e are considered as one outer electrode 502c. In this case, since the equivalent circuit of the capacitor conductor connected to the outer electrodes 502d and 502e is not precisely represented, it is not possible to precisely simulate the circuit on which the three-terminal capacitor 10 to which the second mounting structure illustrated in FIG. 6B is applied is mounted.

In contrast, according to the method for creating an equivalent circuit and the program for creating an equivalent circuit of the preferred embodiments of the present invention, the equivalent circuit 200 includes the outer electrodes 14a and 14b, the inductor component Lt1 and the resistor component Rt1 provided between the connection portion between the line Lin1 and the line Lin3 and the outer electrode 14a, and the inductor component Lt2 and the resistor component Rt2 provided between the connection portion between the line Lin1 and the line Lin3 and the outer electrode 14b. In addition, the equivalent circuit 200 includes the outer electrodes 14c and 14d, the inductor component Lg1 and the resistor component Rg1 provided between the connection portion between the line Lin2 and the line Lin3 and the outer electrode 14c, and the inductor component Lg2 and the resistor component Rg2 provided between the connection portion between the line Lin2 and the line Lin3 and the outer electrode 14d. Accordingly, the equivalent circuit of the capacitor conductor 18a connected between the outer electrodes 14a and 14b is represented and the equivalent circuit of the capacitor conductor 18b connected between the outer electrodes 14c and 14d is represented. In other words, with the equivalent circuit 200, the structure of the three-terminal capacitor 10 is precisely represented. Consequently, the use of the equivalent circuit 200 allows the simulation of the circuit on which the three-terminal capacitor 10 to which the first mounting structure is applied is mounted and the simulation of the circuit on which the three-terminal capacitor 10 to which the second mounting structure is applied is mounted.

Furthermore, according to the method for creating an equivalent circuit and the program for creating an equivalent circuit of the preferred embodiments of the present invention, it is possible to more precisely simulate the circuit on which the three-terminal capacitor 10 is mounted. More specifically, the equivalent circuit 200 includes the capacitor components C1 to C5, the inductor components L1 to L5, and the resistor components R1 to R5. A set of the capacitor component C1, the inductor component L1, and the resistor component R1; a set of the capacitor component C2, the inductor component L2, and the resistor component R2; and a set of the capacitor component C3, the inductor component L3, and the resistor component R3 are connected in parallel to each other. The set of the capacitor component C1, the inductor component L1, and the resistor component R1; a set of the capacitor component C4, the inductor component L4, and the resistor component R4; and a set of the capacitor component C5, the inductor component L5, and the resistor component R5 are connected in parallel to each other. With this configuration, the equivalent circuit of the planer capacitor conductors 18a and 18b is represented. As a result, according to the method for creating an equivalent circuit and the program for creating an equivalent circuit of the preferred embodiments of the present invention, it is possible to more precisely simulate the circuit on which the three-terminal capacitor 10 is mounted.

Furthermore, according to the method for creating an equivalent circuit and the program for creating an equivalent circuit of the preferred embodiments of the present invention, it is possible to reduce the calculation time to determine the variables of the equivalent circuit 200. More specifically, in the three-terminal capacitor 10, as illustrated in FIG. 2, the capacitor conductor 18a has an axisymmetric structure with respect to a straight line B1 passing through the intersection of the diagonal lines of the capacitor conductor 18a and extending in the y-axis direction. As illustrated in FIG. 2, the capacitor conductor 18b has an axisymmetric structure with respect to a straight line B2 passing through the intersection of the diagonal lines of the capacitor conductor 18b and extending in the x-axis direction. Accordingly, the equivalent circuit of the capacitor conductor 18a has a symmetric structure with respect to the straight line B1. Similarly, the equivalent circuit of the capacitor conductor 18b has a symmetric structure with respect to the straight line B2. Consequently, the resistor component Rt1 is set so as to be equal to the resistor component Rt2, the resistor component Rg1 is set so as to be equal to the resistor component Rg2, the inductor component Lt1 is set so as to be equal to the inductor component Lt2, and the inductor component Lg1 is set so as to be equal to the inductor component Lg2. In addition, the capacitor component C2 is set so as to be equal to the capacitor component C3, the inductor component L2 is set so as to be equal to the inductor component L3, and the resistor component R2 is set so as to be equal to the resistor component R3. Furthermore, the capacitor component C4 is set so as to be equal to the capacitor component C5, the inductor component L4 is set so as to be equal to the inductor component L5, and the resistor component R4 is set so as to be equal to the resistor component R5. Accordingly, the number of the variables to be varied in the method for creating an equivalent circuit and the program for creating an equivalent circuit is reduced. As a result, according to the method for creating an equivalent circuit and the program for creating an equivalent circuit of the preferred embodiments of the present invention, it is possible to reduce the calculation time to determine the variables of the equivalent circuit 200.

Figure 8:
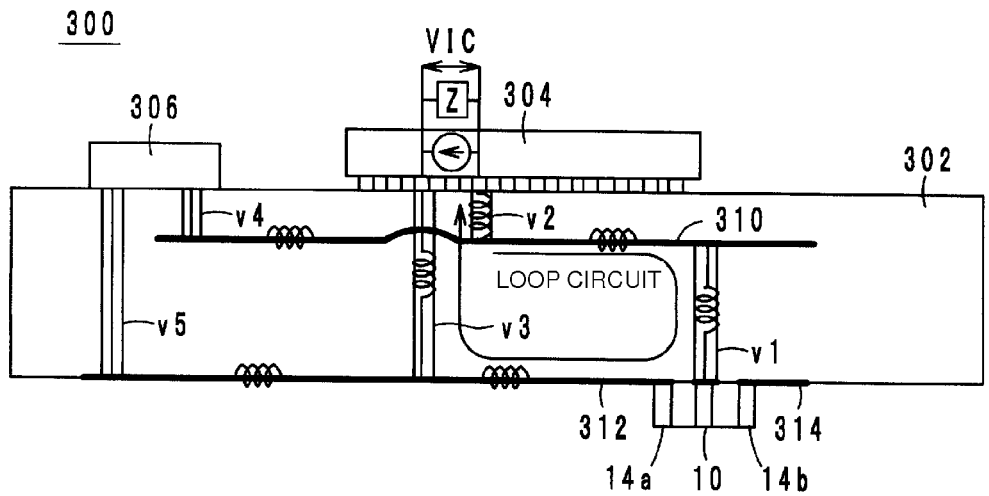
FIG. 8 is a cross-sectional structural diagram of a circuit module.

A non-limiting example of how the equivalent circuit 200 is used will now be described with reference to FIG. 8. FIG. 8 is a cross-sectional structural diagram of a circuit module 300. The vertical direction in FIG. 8 is hereinafter simply referred to as the vertical direction and the horizontal direction in FIG. 8 is hereinafter simply referred to as the horizontal direction.

The circuit module 300 is provided with the three-terminal capacitor 10, a circuit board 302, an integrated circuit (IC) 304, and a direct-current power source 306. The circuit module 300 includes conductor layers 310, 312, and 314 and via hole conductors v1 to v5.

The IC 304 and the direct-current power source 306 are mounted on the main surface at the upper side of the circuit board 302. The three-terminal capacitor 10 is mounted on the main surface at the lower side of the circuit board 302. The three-terminal capacitor 10 is a decoupling capacitor to significantly reduce and prevent variations in the power supply voltage.

The conductor layer 310 extends in the horizontal direction in the circuit board 302. The conductor layer 312 is provided on the main surface at the lower side of the circuit board 302. The right end of the conductor layer 312 is connected to the outer electrode 14a via a land (not illustrated). The conductor layer 314 is provided on the main surface at the lower side of the circuit board 302. The left end of the conductor layer 314 is connected to the outer electrode 14b.

The via hole conductor v1 extends in the vertical direction in the circuit board 302. The upper end of the via hole conductor v1 is connected to the conductor layer 310. The lower end of the via hole conductor v1 is connected to the outer electrodes 14c and 14d of the three-terminal capacitor 10 via a land (not illustrated) (one via hole conductor v1 is illustrated in FIG. 8 for convenience).

The via hole conductor v2 extends in the vertical direction in the circuit board 302. The upper end of the via hole conductor v2 is connected to the IC 304. The lower end of the via hole conductor v2 is connected to the center in the horizontal direction of the conductor layer 310.

The via hole conductor v3 extends in the vertical direction in the circuit board 302. The upper end of the via hole conductor v3 is connected to the IC 304. The lower end of the via hole conductor v3 is connected to the center in the horizontal direction of the conductor layer 312.

The via hole conductor v4 extends in the vertical direction in the circuit board 302. The upper end of the via hole conductor v4 is connected to the direct-current power source 306. The lower end of the via hole conductor v4 is connected to the left end of the conductor layer 310.

The via hole conductor v5 extends in the vertical direction in the circuit board 302. The upper end of the via hole conductor v5 is connected to the direct-current power source 306. The lower end of the via hole conductor v5 is connected to the left end of the conductor layer 312.

The circuit module 300 having the above structure is designed so that the impedance of a loop circuit including the via hole conductor v2, the conductor layer 310, the via hole conductor v1, the three-terminal capacitor 10, the conductor layer 312, and the via hole conductor v3 (hereinafter referred to as a loop impedance) is decreased. In order to decrease the loop impedance, for example, many capacitors are used, low equivalent series inductance (ESL) capacitors are used, the capacitors are arranged close to the pins of the IC 304, or the structures of the conductor layers 310, 312, and 314 and/or the via hole conductors v1 to v5 in the circuit board 302 are varied. In order to determine which method the loop impedance is decreased by, it is effective to use the circuit simulation to design the circuit module 300.

In the circuit simulation of the circuit module 300, three-stage simulation is performed. First, the conductor layers 310, 312, and 314 and the via hole conductors v1 to v5 in the circuit board 302 are input to acquire only the features, or characteristics of the circuit board 302 by electromagnetic simulation. Next, the equivalent circuit of the three-terminal capacitor 10 and the variables of the equivalent circuit are acquired by the method for creating an equivalent circuit and the program for creating an equivalent circuit according to the preferred embodiments of the present invention. Finally, the circuit simulation of the circuit module 300 is performed on the basis of the features, or characteristics of the circuit board 302 acquired by the electromagnetic simulation, the equivalent circuit of the three-terminal capacitor 10, and the variables of the equivalent circuit. The loop impedance of the circuit module 300 is calculated in the above manner.

Other Preferred Embodiments

The present invention is not limited to the method for creating an equivalent circuit and the program for creating an equivalent circuit according to the above preferred embodiments described above and many changes and modified preferred embodiments are possible and included within the true spirit and scope of the present invention.

In the equivalent circuit 200, the capacitor components C2 to C5, the inductor components L2 to L5, and the resistor components R2 to R5 may not be provided. In addition, in the equivalent circuit 200, the resistor components Rt1 and Rt2 and the inductor components Lt1 and Lt2 may not be provided.

The circuit component A1 may include at least one of the resistor component Rt1 and the inductor component Lt1. The circuit component A2 may include at least one of the resistor component Rt2 and the inductor component Lt2. The circuit component A3 may include at least one of the resistor component Rg1 and the inductor component Lg1. The circuit component A4 may include at least one of the resistor component Rg2 and the inductor component Lg2.

The circuit component A5 may include at least one of the inductor component L1 and the resistor component R1, in addition to the capacitor component C1. The circuit component A6 may include at least one of the capacitor component C2, the inductor component L2, and the resistor component R2. The circuit component A7 may include at least one of the capacitor component C3, the inductor component L3, and the resistor component R3.

The circuit component A8 may include at least one of the capacitor component C4, the inductor component L4, and the resistor component R4. The circuit component A9 may include at least one of the capacitor component C5, the inductor component L5, and the resistor component R5.

In the equivalent circuit 200, the set of the capacitor component C1, the inductor component L1, and the resistor component R1; the set of the capacitor component C2, the inductor component L2, and the resistor component R2; and the set of the capacitor component C3, the inductor component L3, and the resistor component R3 are connected in parallel to each other. The set of the capacitor component C1, the inductor component L1, and the resistor component R1; the set of the capacitor component C4, the inductor component L4, and the resistor component R4; and the set of the capacitor component C5, the inductor component L5, and the resistor component R5 are connected in parallel to each other. However, many additional sets of a capacitor component, an inductor component, and a resistor component may be connected in parallel to the set of the capacitor component C1, the inductor component L1, and the resistor component R1.

The control unit 102 calculates the variables of the equivalent circuit 200 when both of the error function values E1 and E2 are minimized in the above preferred embodiments. However, the control unit 102 may calculate the variables of the equivalent circuit 200 when the error function values E1 and E2 are lower than a certain value.

The second S parameter may not be the measured value. For example, when a three-terminal capacitor is distributed to the market and information about the S parameter is posted on, for example, a website, the S parameter may be used as the second S parameter. In this case, the creation of the equivalent circuit on the basis of the preferred embodiments of the present invention allows the features of the three-terminal capacitor to be estimated. For example, when an inductor component of the equivalent circuit is low, it is possible to make an estimation that an inner electrode of the capacitor includes a feature.

As described above, preferred embodiments of the present invention are useful for a method for creating an equivalent circuit and the program for creating an equivalent circuit. More particularly, preferred embodiments of the present invention are excellent in that the circuit on which the three-terminal capacitor is mounted is capable of being precisely simulated.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for creating an equivalent circuit for a three-terminal capacitor including first, second, third and fourth electrodes, a first capacitor conductor connected between the first electrode and the second electrode, and a second capacitor conductor connected between the third electrode and the fourth electrode, the method comprising the steps of:
    creating an equivalent circuit including:
        a first line that connects the first electrode to the second electrode;
        a second line that connects the third electrode to the fourth electrode;
        a third line that includes a first capacitor component and that connects the first line to the second line;
        a first circuit component that includes at least one of a first inductor component and a first resistor component provided between a connection portion between the second line and the third line and the third electrode; and
        a second circuit component that includes at least one of a second inductor component and a second resistor component provided between the connection portion between the second line and the third line and the fourth electrode; and
    calculating values of the first capacitor component, the first inductor component, the first resistor component, the second inductor component, and the second resistor component when a difference between a first S parameter acquired from the equivalent circuit and a certain second S parameter is smaller than a certain value.

2. The method according to claim 1, wherein the first inductor component is equal to the second inductor component, and the first resistor component is equal to the second resistor component.

3. The method according to claim 1, wherein
    the equivalent circuit further includes a third circuit component that includes at least one of a third inductor component and a third resistor component provided between a connection portion between first line and the third line and the first electrode and a fourth circuit component that includes at least one of a fourth inductor component and a fourth resistor component provided between the connection portion between first line and the third line and the second electrode; and
    the step of calculating includes calculating values of the third inductor component, the third resistor component, the fourth inductor component, and the fourth resistor component when the difference between the first S parameter and the second S parameter is smaller than a certain value.

4. The method according to claim 3, wherein the third inductor component is equal to the fourth inductor component, and the third resistor component is equal to the fourth resistor component.

5. The method according to claim 3, wherein the step of calculating includes calculating values of a first coupling coefficient for the first inductor component and the second inductor component and a second coupling coefficient for the third inductor component and the fourth inductor component when the difference between the first S parameter and the second S parameter is smaller than a certain value.

6. The method according to claim 1, wherein the equivalent circuit further includes:
    a fourth line that includes a fifth circuit component including a second capacitor component, a fifth inductor component, and a fifth resistor component and that connects the connection portion between first line and the third line to the third electrode; and
    a fifth line that includes a sixth circuit component including a third capacitor component, a sixth inductor component, and a sixth resistor component and that connects the connection portion between first line and the third line to the fourth electrode; wherein
    the step of calculating includes calculating values of the second capacitor component, the fifth inductor component, the fifth resistor component, the third capacitor component, the sixth inductor component, and the sixth resistor component when the difference between the first S parameter and the second S parameter is smaller than a certain value.

7. The method according to claim 6, wherein the second capacitor component is equal to the third capacitor component, the fifth inductor component is equal to the sixth inductor component, and the fifth resistor component is equal to the sixth resistor component.

8. The method according to claim 1, wherein the equivalent circuit further includes:
    a sixth line that includes a seventh circuit component including a fourth capacitor component, a seventh inductor component, and a seventh resistor component and that connects the connection portion between the second line and the third line to the first electrode; and
    a seventh line that includes an eighth circuit component including a fifth capacitor component, an eighth inductor component, and an eighth resistor component and that connects the connection portion between the second line and the third line to the second electrode; wherein
    the step of calculating includes calculating values of the fourth capacitor component, the seventh inductor component, the seventh resistor component, the fifth capacitor component, the eighth inductor component, and the eighth resistor component when the difference between the first S parameter and the second S parameter is smaller than a certain value.

9. The method according to claim 8, wherein the fourth capacitor component is equal to the fifth capacitor component, the seventh inductor component is equal to the eighth inductor component, and the seventh resistor component is equal to the eighth resistor component.

10. The method according to claim 1, wherein the third line further includes at least one of a ninth inductor component and a ninth resistor component, and the first capacitor component, the ninth inductor component, and the ninth resistor component define a ninth circuit component.

11. The method according to claim 1, wherein the second S parameter is a measured value of an S parameter of the three-terminal capacitor.

12. A non-transitory computer-readable medium including a computer program for performing, when the computer program runs on a computer, a method of creating an equivalent circuit for a three-terminal capacitor including first, second, third and fourth electrodes, a first capacitor conductor connected between the first electrode and the second electrode, and a second capacitor conductor connected between the third electrode and the fourth electrode, the method comprising the steps of:
    creating an equivalent circuit including a first line that connects the first electrode to the second electrode, a second line that connects the third electrode to the fourth electrode, a third line that includes a first capacitor component and that connects the first line to the second line, a first circuit component that includes at least one of a first inductor component and a first resistor component provided between a connection portion between the second line and the third line and the third electrode, and a second circuit component that includes at least one of a second inductor component and a second resistor component provided between the connection portion between the second line and the third line and the fourth electrode; and calculating values of the first capacitor component, the first inductor component, the first resistor component, the second inductor component, and the second resistor component when a difference between a first S parameter acquired from the equivalent circuit and a certain second S parameter is smaller than a certain value.

13. The non-transitory computer-readable medium according to claim 12, wherein the first inductor component is equal to the second inductor component, and the first resistor component is equal to the second resistor component.

14. The non-transitory computer-readable medium according to claim 12, wherein the equivalent circuit further includes a third circuit component that includes at least one of a third inductor component and a third resistor component provided between a connection portion between first line and the third line and the first electrode and a fourth circuit component that includes at least one of a fourth inductor component and a fourth resistor component provided between the connection portion between first line and the third line and the second electrode; and the step of calculating includes calculating values of the third inductor component, the third resistor component, the fourth inductor component, and the fourth resistor component when the difference between the first S parameter and the second S parameter is smaller than a certain value.

15. The non-transitory computer-readable medium according to claim 14, wherein the third inductor component is equal to the fourth inductor component, and the third resistor component is equal to the fourth resistor component.

16. The non-transitory computer-readable medium according to claim 12, wherein the equivalent circuit further includes:

a fourth line that includes a fifth circuit component including a second capacitor component, a fifth inductor component, and a fifth resistor component and that connects the connection portion between first line and the third line to the third electrode; and a fifth line that includes a sixth circuit component including a third capacitor component, a sixth inductor component, and a sixth resistor component and that connects the connection portion between first line and the third line to the fourth electrode; wherein the step of calculating includes calculating values of the second capacitor component, the fifth inductor component, the fifth resistor component, the third capacitor component, the sixth inductor component, and the sixth resistor component when the difference between the first S parameter and the second S parameter is smaller than a certain value.

17. The non-transitory computer-readable medium according to claim 16, wherein the second capacitor component is equal to the third capacitor component, the fifth inductor component is equal to the sixth inductor component, and the fifth resistor component is equal to the sixth resistor component.

18. The non-transitory computer-readable medium according to claim 12, wherein the equivalent circuit further includes:

a sixth line that includes a seventh circuit component including a fourth capacitor component, a seventh inductor component, and a seventh resistor component and that connects the connection portion between the second line and the third line to the first electrode; and a seventh line that includes an eighth circuit component including a fifth capacitor component, an eighth inductor component, and an eighth resistor component and that connects the connection portion between the second line and the third line to the second electrode; wherein the step of calculating includes calculating values of the fourth capacitor component, the seventh inductor component, the seventh resistor component, the fifth capacitor component, the eighth inductor component, and the eighth resistor component when the difference between the first S parameter and the second S parameter is smaller than a certain value.

19. The non-transitory computer-readable medium according to claim 18, wherein the fourth capacitor component is equal to the fifth capacitor component, the seventh inductor component is equal to the eighth inductor component, and the seventh resistor component is equal to the eighth resistor component.

20. The non-transitory computer-readable medium according to claim 12, wherein the third line further includes at least one of a ninth inductor component and a ninth resistor component, and the first capacitor component, the ninth inductor component, and the ninth resistor component define a ninth circuit component.

* * * * *